United States Patent [19]
Zarschitzky et al.

[11] Patent Number: 5,712,730
[45] Date of Patent: Jan. 27, 1998

[54] DIFFRACTIVE OPTICAL DEVICE FOR THE OPTICAL IMAGING OF A SPATIAL POINT ONTO OTHER SPATIAL POINTS

[75] Inventors: Helmut Zarschitzky, Munich; Holger Karstensen, Hohenbrunn, both of Germany

[73] Assignee: Siemens Aktiengesellschaft, Munich, Germany

[21] Appl. No.: 761,809

[22] Filed: Dec. 6, 1996

Related U.S. Application Data

[63] Continuation of Ser. No. 228,282, Apr. 15, 1994, abandoned.

[30] Foreign Application Priority Data

Apr. 16, 1993 [DE] Germany .............................. 43 12 382.1

[51] Int. Cl.⁶ .................................................... G02B 5/18
[52] U.S. Cl. .................................... 359/569; 359/558
[58] Field of Search .................................. 359/10, 20, 15, 359/566, 569, 595, 599, 558, 34

[56] References Cited

U.S. PATENT DOCUMENTS

| | | | |
|---|---|---|---|
| 3,749,922 | 7/1973 | Meeussen | 250/219 D |
| 3,785,712 | 1/1974 | Hannan | 350/3.5 |
| 3,841,729 | 10/1974 | Ando | 350/3.5 |
| 4,170,396 | 10/1979 | Kraft | 350/3.7 |
| 4,421,380 | 12/1983 | McGrew | 350/3.78 |
| 4,697,878 | 10/1987 | Kimura et al. | 350/162.11 |
| 4,829,506 | 5/1989 | Bressers et al. | 359/569 |
| 4,878,735 | 11/1989 | Vilums | 350/131 |
| 4,983,017 | 1/1991 | Tsuji et al. | 359/558 |
| 5,124,843 | 6/1992 | Leger et al. | 359/565 |
| 5,177,637 | 1/1993 | Tsukada | 359/599 |
| 5,258,862 | 11/1993 | Harris | 359/569 |
| 5,296,689 | 3/1994 | Reddersen et al. | 359/17 |
| 5,315,423 | 5/1994 | Hong | 359/17 |
| 5,335,113 | 8/1994 | Jackson et al. | 359/569 |
| 5,345,336 | 9/1994 | Aoyama et al. | 359/569 |
| 5,412,506 | 5/1995 | Feldblum et al. | 385/37 |

FOREIGN PATENT DOCUMENTS 1124122  5/1982  Canada.

OTHER PUBLICATIONS

E. Hecht et al., "OPTICS", Addison–Wesley Publishing Company, pp. 346–364.

*Primary Examiner*—Timothy P. Callahan
*Assistant Examiner*—My-Trang Nu Ton
*Attorney, Agent, or Firm*—Hill, Steadman & Simpson

[57] ABSTRACT

A diffractive optical apparatus has a planarly expansive, diffracting structure with a plurality of structural sub-regions, each of this sub-regions directing a portion of a light falling thereon to onto other spatial points allocated to the structural sub-regions independently of the remaining structural sub-regions. Diffracting structure provides beam splitting with a high fan out and high efficiency for use, for example, in computers at a board level or chip level.

24 Claims, 4 Drawing Sheets

DIFFRACTIVE OPTICAL DEVICE FOR THE OPTICAL IMAGING OF A SPATIAL POINT ONTO OTHER SPATIAL POINTS

This is a continuation of application Ser. No. 08/228,282, filed Apr. 15, 1994, now abandoned.

BACKGROUND OF THE INVENTION

1. Field of the Invention

The present invention is directed generally to a diffractive optical means for the optical imaging of a spatial point onto other spatial points, including a planar light diffracting structure which when illuminated with a light ray from a single spatial point directs a portion of that light ray onto every one of the other spatial points.

2. Description of the Related Art

A diffractive optical means, particularly a means for performing a beam splitting function, may be manufactured in variety of ways. Diffractive optical means may be directly interferometrically recorded using holography by exposing a high-resolution photo material, such as dichromate gelatin, or they can be of a synthetic nature. In synthetic, diffractive optical means, the diffraction pattern, or light-diffracting structure, of the diffractive optical means is calculated in a computer and then the dataset is edited so that either a mask is produced which serves the purpose of contact or projection lithography or the light-diffracting structure is directly inscribed onto a carrier substrate coated with photoresist, such as using the processes of electron beam lithography.

One problem with direct registration is that adequately sensitive photo materials are not available for use in applications in the infrared range above 800 nm light wave length, so that an indirect course must be taken which causes the interferometric exposure at visible wave lengths, usually in the blue spectral range, and a distorted exposure geometry. When a diffractive optical means having a fan out of less than one is required and when the output rays are to be emitted at arbitrary deflection angles, the diffractive optical means can not be interferometrically recorded. The problem of the wave length difference between the exposure and the employment of the diffractive optical means can no longer be resolved for a holographic means by a simple variation of the exposure geometry. Synthetic holographic optical devices or specific diffractive devices are required for such jobs.

A core problem of synthetic devices is that they have a limited diffraction efficiency, which lies at a maximum of approximately 40% given binary, phase-wise, diffractive optical means. An increase in the efficiency is possible by profiling of the grid furrows of the device; however, the manufacturing outlay for this rises substantially. A high-performance computer having a large memory capacity and high speed is already required for calculating the devices. Technologies such as electron beam lithography, ion etching techniques, and vapor-deposition processes that are complicated but can be governed are required for user-friendly means which cause short focal lengths and large deflection angles as well.

SUMMARY OF THE INVENTION

An object of the present invention is to provide a diffractive optical means whose calculation and coding allows a governable set of structure data to be provided and which nonetheless has acceptable beam quality and an efficiency that lies at or above 40% despite a high fan out.

This and other objects and advantages of the invention are achieved a diffractive optical structure having two or more structural sub-regions illuminated by a light ray, each of the structural sub-regions direct at least a portion of that part of the illuminating light ray which falls upon this structural sub-region onto an existing other spatial point or, in the case of two or more existing spatial points, onto another spatial point allocated to the structural sub-region independently of other structural sub-regions.

Various advantages are achieved when a group of two or more structural sub-regions are allocated to each of two or more existing other spatial points and each and every one of such structural sub-regions directs at least a portion of that part of the illuminating light ray falling thereupon only onto this other spatial point. Preferably, the structural sub-regions of a group allocated to another spatial point are distributed over the entire surface of the diffracting structure. It is desired that the structural sub-regions adjoin one another without gaps therebetween. In one embodiment, each structural sub-region defines a polygon and in a specific embodiment each structural sub-region defines a hexagon.

It is preferred that only one structural sub-region is allocated to each of two or more existing other spatial points, the only one structural sub-region directing at least a portion of that part of the illuminating light ray which falls thereupon only onto this allocated, other spatial point. Such structure includes structural sub-regions adjoined to one another without gaps therebetween.

One of these substructural sub-regions may be a diffraction grating structure, and preferably every structural sub-region of the diffracting structure is a diffraction grating structure and the diffraction grating structure of structural sub-regions directed onto different, other spatial points are different from one another. The diffraction grating structures of every group of two or more structural sub-regions directing light only onto another spatial point are excerpts of a common, higher-ranking structure. Preferably, the diffraction grating structure in a sub-region is relief-like. The relief-like sub-region may either be of a sawtooth profile, a graduated profile, or a profile which is graduated in steps. Preferably, the relief-like diffraction grating structure is formed a portion from a Fresnel zone lens.

It is preferred that the diffracting structure define an area of an oval shape as the aperture. The structural sub-regions in the surface of the diffracting structure are elongated in the direction of the largest average deflection angle, as defined by the position of all other spatial points, between an axis of the light ray and an axis shared in common by all of the sub-rays directed by the diffracting structure onto the other spatial points.

In a particular application, the one spatial point is defined by an exit window of an optical transmitter that generates the light ray. The other spatial point is defined by a light entry window of an optical receiver for receiving the optical signal of that portion of the light ray which is directed onto the light entry window.

The diffraction means of the present invention provides a high fan out with good quality for the individual output rays. The diffraction means can be operated in reflection, for example as a mirror having many focal spots, or can be operated in transmission, for example as a multifocal lens. A plurality of optical functions can be implemented with the single, planar diffraction means of the invention. The means according to the present invention is a beam splitter with fan out that can have arbitrary deflection angles for the individual rays. Moreover, the rays can also be focused. The optical means of the invention is suitable for optical open-beam connections and can be utilized, for example, at the board level or at the chip level for optical timing signal distribution in computers.

For a fan out of less than 100, the diffraction means of the present invention has advantages compared to holographically optical means which perform the same function. As a consequence of the spatial multiplex character, the light-diffracting structure of a holographically optical means is extremely complicated. In synthetic, computer-generated means, involved coding methods and enormous datasets are required. By contrast, the present diffraction means is composed of many individual structural sub-regions or facettes which contain simple diffraction grating structures. These generally are curved gratings. Compared to the holographically defined optical means, the coating becomes substantially simpler and the dataset is substantially reduced. A further advantage of the present diffraction means is that the diffraction grating structures of the individual structural sub-regions can be provided a suitable profile, so that the efficiency thereof is substantially enhanced as a result. Advantageously, a fan out up to 100 or more output beams can be achieved.

BRIEF DESCRIPTION OF THE DRAWINGS

The invention shall be set forth by way of example in greater detail in the following with reference to drawing figures.

DETAILED DESCRIPTION OF THE PREFERRED EMBODIMENTS

Figure 1:
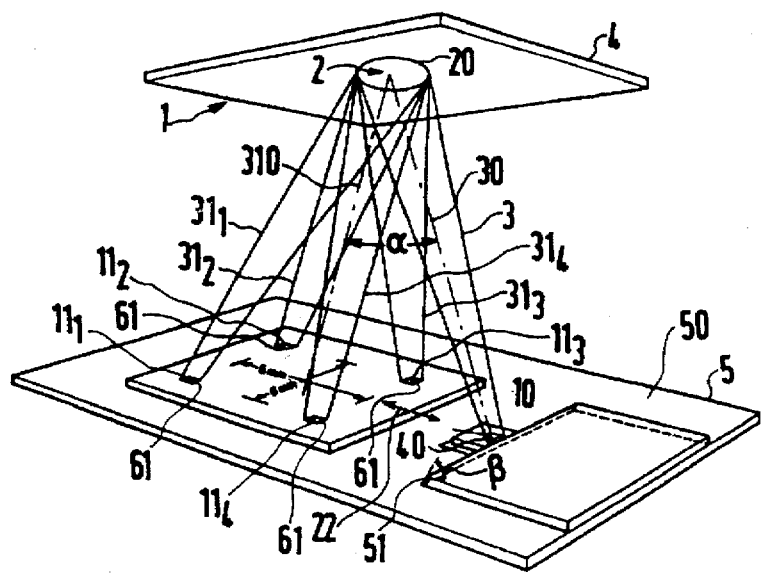
FIG. 1 is a perspective view of an exemplary arrangement having a diffractive means according to the principles of the present invention with fan out of four that directs an obliquely incident and highly divergent laser beam of a laser diode onto four optical detectors.

Referring first to FIG. 1, a semiconductor unit 40 and, for example, four optical receivers 61 are integrated at a distance from one another on a surface 50 of a substrate 5. The semiconductor unit 40 is a laser having a light exit window from which a highly divergent laser beam 3 emerges. The light exit window is in a direction parallel to the surface 50 of the substrate 5 and defines one spatial point 10. The light entry windows of each optical receiver 61 define the other spatial points $11_1$, $11_2$, $11_3$ and $11_4$ for receiving the light beam, in other words, the light entry windows are the further spatial points at which the divergent beam from the laser is to be imaged by the diffractive optical means 1.

Figure 2:
FIG. 2, FIG. 2a, and FIG. 2b are plan views of examples of a diffractive means according to the invention whose light-diffracting structure comprises a plurality of rectangular structural sub-regions each respectively including a diffraction grating structure, wherein four different groups of structural sub-regions are distinguished, the groups differing from one another on the basis of the diffraction grating structures in their structural sub-regions, and wherein the rectangular structural sub-regions are demarcated from one another by the addition of lines in FIG. 2a and are thereby made clearly visible and wherein one of the four groups of structural sub-regions is blackened for emphasis in FIG. 2b.
Figure 2A:
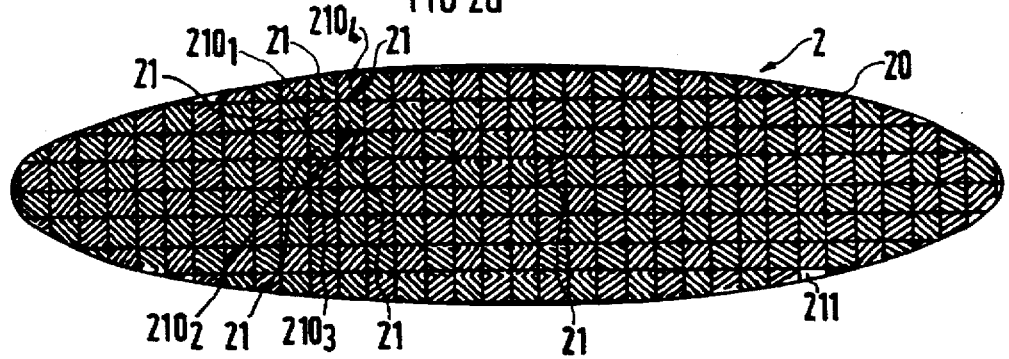

In the arrangement of FIG. 1, the laser beam 3 propagates parallel to the surface 50 and impinges a mirror surface 51 which is mounted obliquely at the angle $\beta$ of, for example, 56° relative to the surface 50. The mirror 51 reflects the laser beam 3 from the surface 50 in an upward direction so that it propagates divergently and obliquely at the angle $\beta$ and impinges obliquely onto a planar, light-diffracting structure 2 of the optical means 1 of the present invention. The light diffraction structure 2 is therefore disposed over the surface 50 on a carrier 4 so that the structure 2 is illuminated by the divergent beam. The light diffracting structure 2 is formed so that it directs a part of the power of the laser beam 3 in the form of a sub-beam $31_1$ onto the spatial point $11_1$, and to direct sub-beams $31_2$, $31_3$ and $31_4$ onto respective other spatial point $11_2$, $11_3$ and $11_4$. The diffractive structure 2 causes the sub-beams $31_1$ through $31_4$ to have the special characteristic of each being convergent and bundled, or focused, onto the respective spatial points $11_1$ through $11_4$. To achieve this, the diffractive structure 2 of the diffraction means 1 includes a plurality of sub-regions which are illuminated by the light ray 3 and which, independently of the other sub-regions, focuses a part of the illuminating light ray onto the corresponding one of the four other spatial points. A diffraction structure 2 for accomplishing this is illustrated in FIG. 2 which shows a diffractive structure by which a portion of the illuminating light ray 3 which falls onto a structural sub-region is reflected by the diffractive means onto a specific corresponding other spatial point. The diffractive structure 2 is made up of individual, rectangular structural sub-regions which are adjoined to one another without gaps therebetween, as can be seen in FIG. 2. The same diffractive structure 2 is shown in FIG. 2a with the addition of horizontal and vertical lines superimposed thereover to demarcate the individual structural sub-regions 21 from one another. The horizontal and vertical demarkation lines are not present in reality, but are only shown to facilitate the explanation of the present invention. It can be clearly seen that the structural sub-region 21 are of a quadrilateral shape and are adjoined to one another. Each structural sub-region 21 shown in FIG. 2a comprises a diffraction grating structure $210_1$–$210_4$. Two types of diffraction grating structures are present, namely diffraction grating structures $210_1$ and $210_3$ wherein grid lines proceed obliquely from the bottom left to the upper right, and the diffraction grating structures $210_2$ and $210_4$, wherein grid lines proceed from the upper left to the bottom right. In this sense, the diffractive structure 2 of FIG. 2 is a binary, diffractive structure. The diffraction grating structures $210_1$ and $210_3$, just like the diffraction grating structures $210_2$ and $210_4$, differ in terms of the fashioning of their grid lines. For example, it can be specifically established that the grid lines of every structural sub-region 21 having a diffraction grating structure $210_1$ focuses that part of the illuminating light ray 3 which impinges thereon onto the other spatial point $11_1$ allocated thereto due to the formation of its grid lines. Every structural sub-region 21 having a diffraction grating structure $210_2$ focuses that part of the illuminating light ray 3 falling thereon onto the further spatial point $11_2$ allocated thereto due to the structure of its grid lines. Likewise, every structural sub-region 21 having a diffraction grating structure $210_3$ focuses that part of the illuminating light ray 3 falling thereon onto the further spatial point $11_3$ allocated thereto due to the formation of its grid lines, and every structural sub-region 21 having a diffraction grating structure $210_4$ focuses that part of the illuminating light ray 3 falling thereon onto the further spatial point $11_4$ allocated thereto due to the formation of its grid lines.

Moreover, a respective group composed of a plurality of structural sub-regions 21 having a diffraction grating structure $210_1$, or $210_2$, or $210_3$, or $210_4$ is allocated to every other spatial point $11_1$, or $11_2$, or $11_3$, or $11_4$, respectively. These structural sub-regions 21 focus a portion of that part of the illuminating light ray 3 falling thereon onto the respective other spatial point $11_1$, $11_2$, $11_3$ or $11_4$.

In the illustrated embodiment, although not necessary in every embodiment, the sub-regions 21 alternate in a matrix-like arrangement of the diffraction grating structures $210_1$, $210_4$ in one horizontal row and in a subsequent horizontal row structural sub-regions having diffraction grating structures $210_2$ and $210_3$. Moreover, the vertical columns have alternating sub-regions 21 of diffraction grating structures $210_1$ and $210_2$ which alternate with vertical columns of structural sub-regions 21 having diffraction grating structures $210_4$ and $210_3$ in a horizontal direction.

In accordance therewith, the structural sub-regions 21 of every group is composed of a plurality of structural sub-regions 21, each and every one of which focuses at least one portion of the part of the illuminating light ray falling thereon onto only one other spatial point and are arranged in a matrix-like structure and at a distance from one another in horizontal rows and in vertical columns and are distributed over the entire area of the diffractive structure 2 which is illuminated by the light ray 3.

Figure 2B:
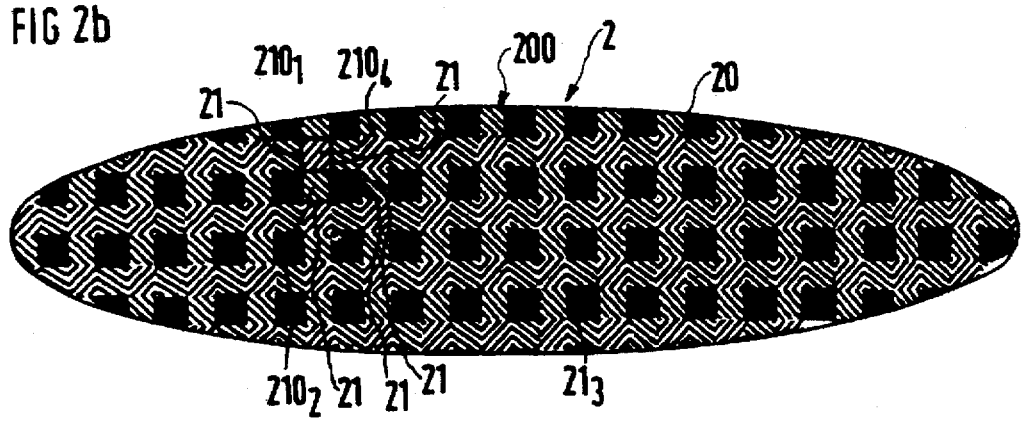

Referring to FIG. 2b, a group 210 composed of the plurality of structural sub-regions 21 having the diffraction grating structure $210_3$, each of which focuses at least a portion of the illuminating light ray 3 which falls onto it only the others spatial point $11_3$, is emphasized by being blackened so as to make it more clearly visible. It is thus shown that the sub-regions 21 having the diffraction grating structure $210_3$ are distributed regularly over the surface of the diffractive means. Each of the other sub-regions 21 for the corresponding diffraction grating structures $210_1$, $210_2$ and $210_4$ are in a likewise regular distribution over the surface. It is also possible that a different distribution of sub-regions may be utilized, including, for example, an irregular distribution.

Every structural sub-region 21 of the diffractive means shown in FIG. 2 can be interpreted as a rectangular aperture which diffracts light from a light ray 3 and which is small in comparison to the overall aperture or illuminated area of the diffractive structure 2. When, for example, a rectangular structural sub-region is a lens having a rectangular aperture and focusing onto the allocated other spatial points, then the diffraction pattern which describes the intensity distribution of this focus and is in the image or focal plane in which the other spatial point lies is not rotationally symmetrical as in the case of a lens having a circular aperture, such as a Fresnel lens, which would be desirable in most applications. Instead, the diffraction patter has a shape similar to two crossed lines. The publication of E. Hecht, A. Zajak, "OPTICS", Addison-Wesley Publishing Company (1977) illustrates the diffraction patterns of lenses having circular and rectangular apertures. When such rectangular apertures are interconnected in a randomly acting arrangement, then a diffraction pattern in the form of a substantially smaller and more of a round spot but usually having beam-shaping spurs results.

The shape of the diffraction pattern, however, is still highly dependent on the shape of the structural sub-regions 21, even for a distributed arrangement of structural sub-regions 21. It is desirable that an optimum round shape of the structural sub-regions 21 be used. Polygons which have more than four corners are advantageous. A meaningful compromise between an optimally round structural sub-region 21 and a diffractive structure having an overall aperture or illuminated area which is filled in without gaps with such structural sub-regions 21 can be achieved by hexagonal shaped structural sub-regions 21.

Figure 3:
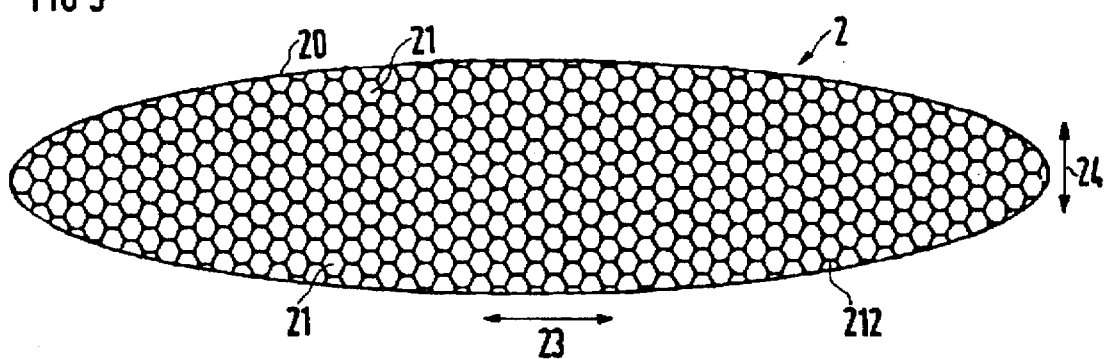
FIG. 3 is a plan view of an embodiment of a diffractive means according to the present invention having hexagonal structural sub-regions that form a honeycomb pattern.

In FIG. 3 is shown a diffractive structure 2', having black border 212 which serves as a visible, hexagonal limitation for each structural sub-region, although the boarder 212 is not necessary present in reality but is shown here merely for purposes of illustration. The embodiment of FIG. 3 thereby includes structure sub-regions, each having an aperture of a hexagonal shape. Although the diffraction pattern of the hexagonal structural sub-region still has bean-shaping spurs due to its angular shape, a rounder spot which is similar to the diffraction pattern of a lens having a circular aperture is nonetheless possible by superimposing the diffraction patterns of the group composed of the hexagonal structural sub-regions 21 allocated to the same, further spatial point.

To assure an optimally round diffraction pattern given a diffractive structure 2 which is to be utilized for arrangements having a pronounced off-access geometry, it is expedient when the structural sub-regions 21 in the plane of the diffractive structure 2, in other words, in the plane of the drawing of FIGS. 2–8, are elongated in the direction 22 (see FIG. 1) of the largest average reflection angle $\alpha$ between the axis 30 of the light ray 3 defined by the position of all spatial points 11 and of an axis 310, which is shared by all sub-rays 31 and is directed from the diffractive structure 2 onto the other spatial points 11. The axis 310 is, for example, the central axis of all sub-rays 31.

Figure 4:
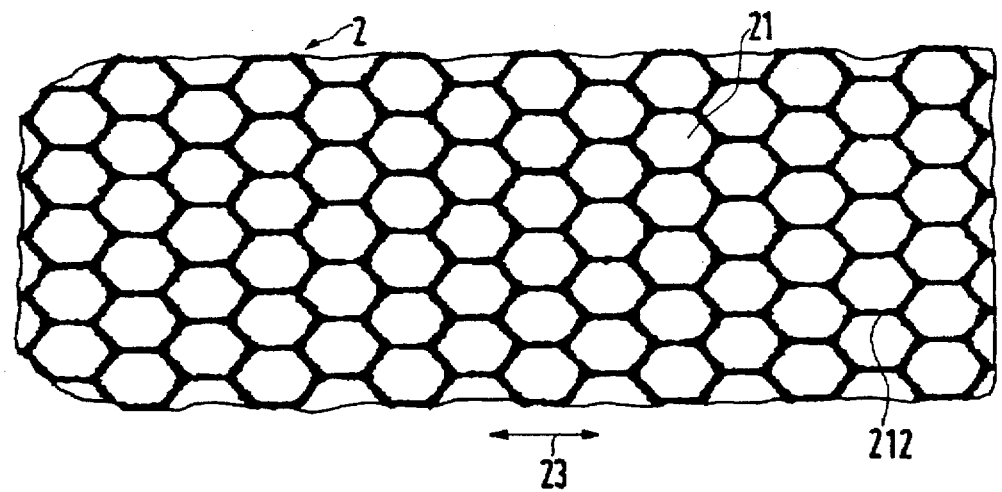
FIG. 4 is an enlarged view a modification of the diffractive means of FIG. 3, wherein the hexagonal structural sub-regions are stretched in a horizontal direction.
Figure 5:
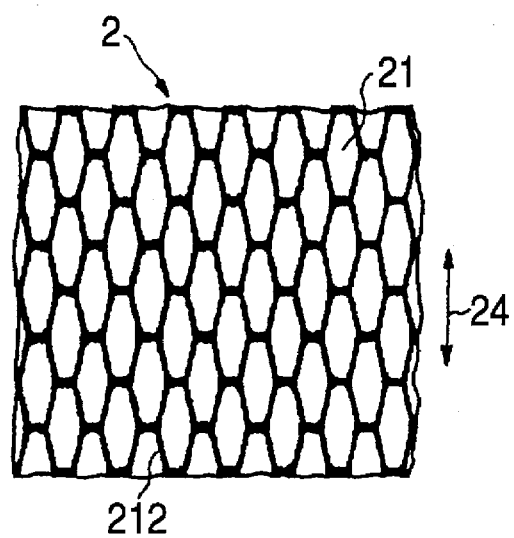
FIG. 5 is an enlarged view of another modification of the diffractive means of FIG. 3, wherein the hexagonal structural sub-regions are stretched in a vertical direction.

It is possible to elongate the hexagonally shaped sub-regions 21 of FIG. 3, for example. In particular, FIG. 4 shows a portion of a diffractive structure 2 having an elliptical aperture as shown in FIG. 3 wherein the structural sub-regions 21 are elongated in the horizontal direction 23, in other words, in the direction of the major semiaxis of the ellipse. By contrast, FIG. 5 shows an exemplary embodiment of a diffractive structure 2 wherein the hexagonal shaped structural sub-regions 21 are elongated in the vertical direction 24, in other words, in the direction of the minor semiaxis of the ellipse. The structural sub-regions 21 may be elongated in any other desired direction.

The hexagonally shaped structural sub-regions 21 of FIGS. 3–5 may be diffraction grating structures, such as diffraction grating structures 210 as shown in FIG. 2. A binary diffraction pattern established by the diffraction grating structures 210 results in the diffractive structures as shown in FIGS. 2–5. Such diffractive structures have diffraction efficiencies of a maximum of approximately 40%. The diffraction efficiency can be enhanced, however, when the grid line or furrows of the diffraction grating structures in the structural sub-regions 21 are profiled.

Figure 6:
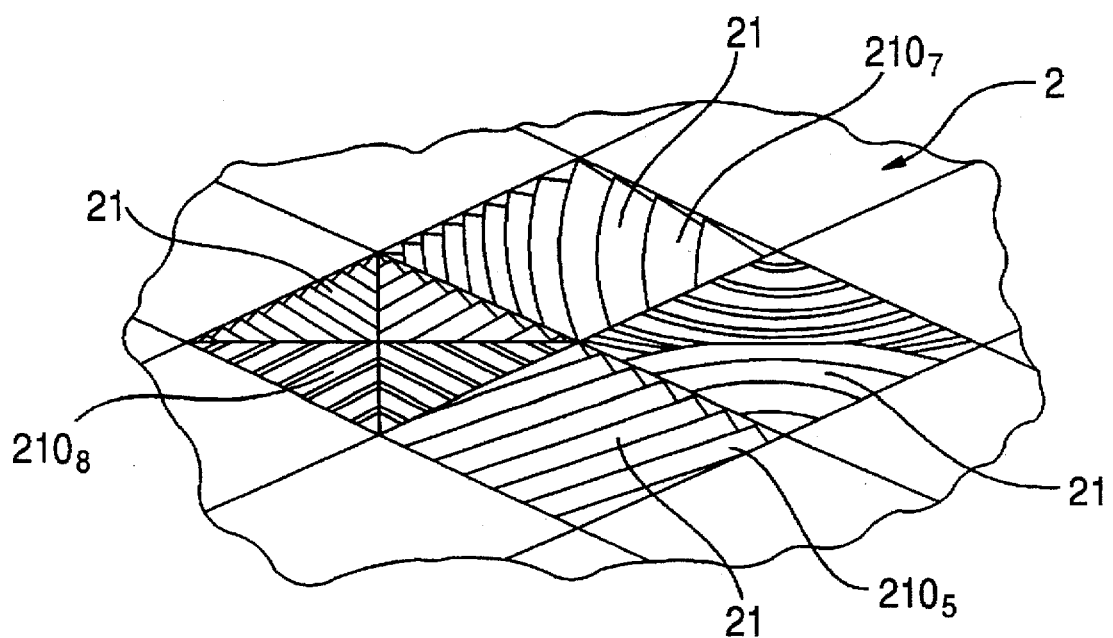
FIG. 6 is an enlarged portion of a diffractive means according to the present invention having quadrangular structural sub-regions that have, for purposes of discussion, various examples of relief-like diffraction grating structures, these structures not being limited to a quadrangular shape of the structural sub-regions but being used for all structural sub-regions.

In simple beam deflectors, diffraction grating structures whose grid furrows have a sawtooth-like profile may be used, for example. As shown in FIG. 6, a diffraction grating structure $210_5$ is an example of the saw-tooth profile, showing a portion of a diffractive structure 2 having lozenge-shaped structural sub-regions 21, although the invention is not limited to this shape.

Figure 7:
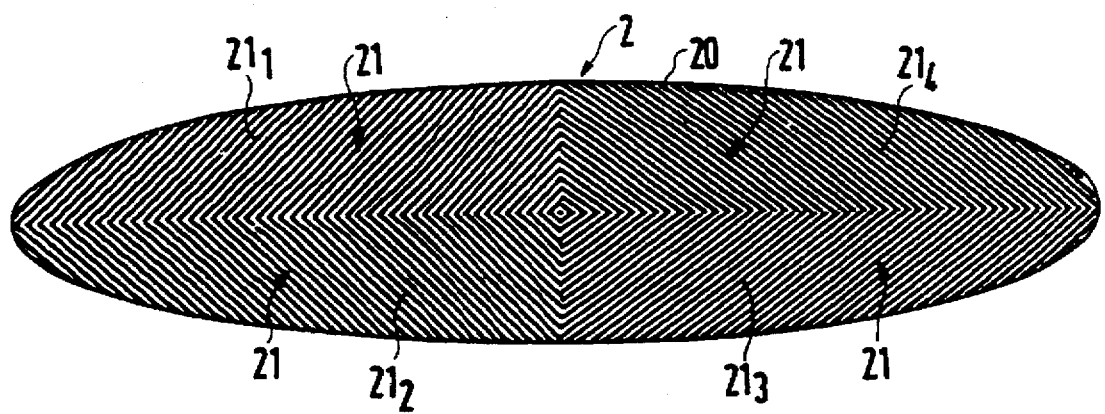
FIG. 7 is a plan view of a diffractive means of the invention having only four structural sub-regions which differ from one another by their diffraction grating structures.

In beam deflectors that provide focusing of the beam, diffraction grating structures which are portions of Fresnel lenses may be used, for example. An example of such structure is shown in FIG. 7, wherein the diffraction grating structure $210_7$ is a portion of Fresnel lens.

Combinations of such diffraction grating structures in one structural sub-region 21 are also possible. For example, FIG. 6 shows a diffraction grating structure $210_8$ of a first example wherein four portions from a diffraction grating structure having sawtooth-like grid furrows are combined in a structural sub-region 21, whereby the grid furrows differ in sections thereof in the direction of the profile. Another example is the diffraction grating structure $210_6$ wherein two portions of different Fresnel lenses are combined in one structural sub-region.

Diffraction grating structures which have a step-like profile with, for example, four to eight steps may also be employed since these being capable of being manufactured by, for example, multi-stage lithography processes.

The height of the possible fan out derives from the minimum size of the individual structural sub-region 21, which can be interpreted as a facette of the diffractive structure 2, from the area illuminated by the light ray 3, and from the necessary number of individual structural sub-regions 21 that must be allocated to a group of structural sub-regions 21 focusing onto the same other spatial point in order to achieve a required focus quality. A fan out of up to 100 is possible.

In FIG. 7 is shown an example of a diffractive structure 2 in which every structural sub-region 21 deflects a sub-ray 31 only onto one of the other, existing spatial points 11. In the example of FIG. 7, only four other spatial points 11 are present, so that the diffractive structure 2 has only four structural sub-regions 21. Each of the four structural sub-regions 21 comprises a different diffraction grating structure which is fashioned to direct a sub-ray 31 onto the allocated, other spatial point 11. For example, the diffraction grating structure $21_1$ directs or focuses the sub-rays $31_1$ onto the other spatial point $11_1$, while the diffraction grating structure $21_2$ directs or focuses the sub-ray $31_2$ onto the other spatial point $11_2$, and the diffraction grating structure $31_3$ directs or focuses the sub-ray $31_3$ onto the other spatial point $11_3$ and, similarly the diffraction grating structure $21_4$ directs or focuses the sub-ray $31_4$ onto the other spatial point $11_4$.

A diffractive structure 2 according to the present invention can be limited by an edge 20 which defines the aperture of this structure 2 and that may be shaped elliptically or in some other shape. However, it may be the case that the diffractive structure 2 has no such edge 20 but extends over the entire surface of the carrier 4 of FIG. 1. The aperture of the structure is then defined only by the region that is illuminated by the light ray 3. In the case of an obliquely incident light ray 3 having a circular cross section, the illuminated region is ellipsoidal, as shown in FIGS. 2, 3 and 7.

Figure 8:
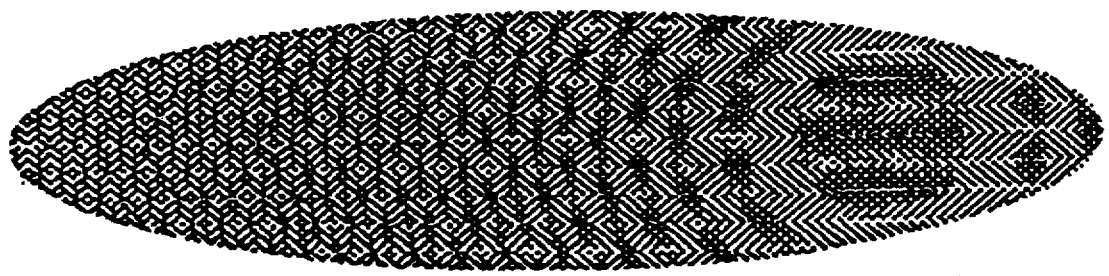
FIG. 8 is a plan view of a synthetic, binary, holographic optical element for beam-splitting in accordance with the illustration in FIG. 1.

As shown in FIG. 8, a synthetic, binary, holographic optical element does not have any structural sub-regions as does the present invention and is shown herein only for the purposes of comparison to the diffractive structures of the invention.

Thus, there is shown and described a diffractive optical means for the optical imaging of a spatial point onto other spatial points. The diffractive optical means has a planarly expansive diffracting grating which has a plurality of structural sub-regions for illumination by a light ray. Each structure sub-region directs at least a portion of the illuminating beam falling thereon onto an allocated one of another spatial point independently of the other structural sub-regions. The diffracting structure of the invention enables calculation and coating of diffractive optical means by a governable set of structured data and, moreover, has an acceptable beam quality despite a high fan out and an efficiency of 40% or more. The present diffractive optical means may be used, for example, in optical signal distribution in computers at either the board level of the chip level.

Although other modifications and changes may be suggested by those skilled in the art, it is the intention of the inventors to embody within the patent warranted hereon all changes and modifications as reasonably and properly come within the scope of their contribution to the art.

I claim:

1. A diffractive optical structure for the optical imaging of a defined spatial point onto at least two other spatial points, comprising:

a planarly expansive, defined, light-diffracting structure for illumination by a light ray proceeding from the defined spatial point, the light diffracting structure including a plurality of structural sub-regions, each of said structural sub-regions directing at least a portion of an illuminating light ray falling onto said structural sub-region onto a corresponding one of the other spatial points so that portions of the light ray falling on said light-diffracting structure are directed onto each one of the other spatial points, a group of at least two of said structural sub-regions directing light onto only one of said at least two other spatial points, so that each of said structural sub-region of said group directs light impinging it onto a same one of said other spatial points as other subregions of said group.

2. A diffractive optical structure as claimed in claim 1, wherein said structural sub-regions of said group are distributed over an entire surface of said diffractive structure.

3. A diffractive optical structure as claimed in claim 2, wherein said structural sub-regions adjoin one another free of gaps.

4. A diffractive optical structure as claimed in claim 2, wherein each of said structural sub-regions define a polygon.

5. A diffractive optical structure as claimed in claim 2, wherein each of said structural sub-regions define a hexagon.

6. A diffractive optical structure as claimed in claim 4, wherein said structural sub-regions are elongated in a direction of a largest average deflection angle between an axis of the light ray and an axis shared in common by all sub-rays directed by the diffracting structure onto the other spatial points.

7. A diffractive optical means as claimed in claim 1, wherein said structural sub-regions adjoin one another free of gaps.

8. A diffractive optical structure as claimed in claim 1, wherein said structural sub-regions each comprise a diffraction grating structure.

9. A diffractive optical means as claimed in claim 8, wherein each of said structural sub-regions comprise a diffraction grating structure and said diffraction grating structures of said structural sub-regions are directed onto mutually different ones of said other spatial points.

10. A diffractive optical structure as claimed in claim 9, wherein said structural sub-regions are in groups of at least two structural sub-regions and said structural sub-regions are excerpts of a common, higher-ranking structure.

11. A diffractive optical structure as claimed in claim 8, wherein said diffraction grating structure of a structural sub-regions is relief-like.

12. A diffractive optical structure as claimed in claim 11, wherein said relief-like diffraction grating structure is of a sawtooth profile.

13. A diffractive optical structure as claimed in claim 11, wherein said relief-like diffraction grating structure is of a graduated profile.

14. A diffractive optical structure as claimed in claim 13, wherein said graduated profile is a profile graduated in steps.

15. A diffractive optical structure as claimed in claim 11, wherein said relief-like diffraction grating structure is a portion of a Fresnel zone lens.

16. A diffractive optical structure as claimed in claim 1, wherein said light diffracting structure has an edge defining an aperture of an oval shape.

17. A diffractive optical structure as claimed in claim 1, wherein said defined spatial point is an exit window of an optical transmitter that generates the light ray.

18. A diffractive optical structure as claimed in claim 1, wherein said other spatial points are light entry windows of an optical receiver for receiving optical signals directed onto said light entry windows.

19. A diffractive optical structure for optical imaging of a defined spatial point as a source onto a plurality of other spatial points as receivers, comprising:

a planarly expansive light-diffracting structure for illumination by a light ray from said source, said light-diffracting structure including a plurality of sub-regions distributed over said light-diffracting structure;

a plurality of groups of said sub-regions on said light-diffracting structure, each of said groups being characterized by diffracting the light ray onto a corresponding one of said receivers; and said groups each including a plurality of said sub-regions, all sub-regions of each of said groups diffracting light onto corresponding ones of said receivers so that one sub-region of a group directs a portion of the light ray falling onto it onto one of said receivers and another sub-region of said same group directs a portion of the light falling into it onto a same one of said receivers.

20. A diffractive optical structure as claimed in claim 19, wherein said plurality of sub-regions of each of said groups is distributed over said planarly expansive light-diffracting structure and said sub-regions of ones of said groups being interspersed with sub-regions of others of said groups.

21. A diffractive optical structure as claimed in claim 19, wherein said sub-regions are distributed in a regular arrangement over said light-diffracting structure.

22. A diffractive optical structure as claimed in claim 21, wherein said regular arrangement is a matrix.

23. A diffractive optical structure as claimed in claim 21, wherein said regular arrangement is an arrangement of hexagonal sub-regions.

24. A diffractive optical structure as claimed in claim 19, wherein a number of said groups equals a number of said receivers.

* * * * *